United States Patent [19]
Ota et al.

[11] Patent Number: 5,568,068
[45] Date of Patent: Oct. 22, 1996

[54] BUFFER CIRCUIT FOR REGULATING DRIVING CURRENT

[75] Inventors: Yoshiyuki Ota; Ichiro Tomioka, both of Kanagawa; Eiji Murakami, Hyogo, all of Japan

[73] Assignees: Mitsubishi Denki Kabushiki Kaisha, Tokyo; Mitsubishi Electric Semiconductor Software Co., Ltd., Itami, both of Japan

[21] Appl. No.: 534,114

[22] Filed: Sep. 26, 1995

[30] Foreign Application Priority Data

Jun. 8, 1995 [JP] Japan .................................. 7-141896

[51] Int. Cl.$^6$ .................................................. H03K 19/003
[52] U.S. Cl. ............................... 326/82; 326/21; 326/34; 326/83; 327/264
[58] Field of Search .............................. 326/21, 30, 31, 326/34, 82–83, 86; 327/264–265

[56] References Cited

U.S. PATENT DOCUMENTS

| | | | |
|---|---|---|---|
| 4,719,369 | 1/1988 | Asano et al. | 326/30 |
| 5,107,230 | 4/1992 | King | 326/30 X |
| 5,134,311 | 7/1992 | Biber et al. | 326/82 X |

FOREIGN PATENT DOCUMENTS

| | | |
|---|---|---|
| 2-82715 | 3/1990 | Japan . |
| 5-102828 | 4/1993 | Japan . |
| 6-311016 | 11/1994 | Japan . |

*Primary Examiner*—David R. Hudspeth
*Attorney, Agent, or Firm*—Oblon, Spivak, McClelland, Maier & Neustadt, P.C.

[57] ABSTRACT

A buffer circuit with driving current adjusting function is provided which may automatically set a driving current characteristics of a buffer to the most suitable value according to a system where the driving current is to be applied. A buffer circuit with driving current adjusting function of the present invention comprises a buffer circuit which is controlled by a control signal for supplying a most appropriate driving current to a load; a load detecting circuit for detecting a phase difference between an input signal and an output signal of the buffer circuit and for outputting voltage corresponding to the phase difference, a control signal generating circuit for generating a signal which controls the driving current of the buffer circuit in response to an output signal of the load detecting circuit, the control signal controls so that the driving current of buffer circuit is increased when delay time of buffer circuit becomes long and the driving current of buffer circuit is decreased when delay time becomes short.

11 Claims, 18 Drawing Sheets

|     | m<Th(1) | Th(1)≤m<Th(2) | Th(2)≤m<Th(3) | ~ | Th(n-1)≤m<Th(n) | Th(n)≤m |
|-----|---------|---------------|---------------|---|-----------------|---------|
| Q1  | 0       | 1             | 1             | ~ | 1               | 1       |
| Q2  | 0       | 0             | 1             | ~ | 1               | 1       |
| ..  | ..      | ..            | ..            | ~ | ..              | ..      |
| Qn-1| 0       | 0             | 0             | ~ | 1               | 1       |
| Qn  | 0       | 0             | 0             | ~ | 0               | 1       | n BIT m : PULSE NUMBER OF INPUT SIGNAL 236

Th(x) : THRESHOLD DETERMINED BY FLIP-FLOP 251-x

Qx : Xth LOGICAL VALUE OF SIGNAL 229

FIG. 12

BUFFER CIRCUIT FOR REGULATING DRIVING CURRENT

BACKGROUND OF THE INVENTION

1. Field of the Invention

The invention relates to a semiconductor integrated circuit, specifically relates to an output buffer circuit and its peripheral circuit which improve output characteristics of a signal from a semiconductor integrated circuit (IC).

2. Description of the Prior Art

An output buffer circuit is usually equipped at an output portion of IC for amplifying a feeble IC output signal to a level which is large enough to drive an outside load circuit. The driving current of the output buffer is decided by a size of a transistor. Therefore, in a conventional buffer design, the transistor size is decided when designing pattern layout of the transistors by predicting an outside load capacity which is connected to the buffer in order to obtain the buffer capacity which is enough to provide the current to the outside load.

According to speeding-up and up-sizing of recent electronic apparatus such as personal computers, operation speed and driving current of the output buffer circuit equipped in IC is required to increase higher and larger, respectively. Further, as IC is applied to electronic equipments widely, the buffer circuit is required to correspond to a various kinds of load capacities. But, in the past, the driving current of the output buffer has been decided at the time of pattern layout design, as described above. Therefore, it is difficult to set and decide the most suitable driving current of the output buffer in response to the load of electronic equipments such as personal computer board which is added later to the electric apparatus.

In recent years, as shown in FIG. 21, electronic equipments such as a personal computer are becoming to use systems which add an extension 14 like RAM card or a ROM card at a later time, or systems which are compatible with many kinds of power supplies which are switched between ac power supply and dc power supply like battery.

In such extension, when adding such extension 14 to IC 11 using a connector 13, it is required to provide a bus driver 12 between a connector 13 and the IC 11 which provides current enough to additional load capacity, which leads to a large size and a high cost of apparatus. In other words, buffer capacity of such systems is designed in consideration with an additional load capacity which is added later on. If the additional load capacity exceeds a predetermined designed value, delay time of providing current increases and then transmission errors increase. Also, in case there is no additional load capacity, power supply voltage of the system varies by switching current between ac power supply and dc power supply like battery, which also causes transmission errors.

In case of setting a driving current of the buffer rather higher in consideration with a high-speed operation system so that IC 11 is compatible with many kinds of power supplies, there is some problem that errors occur by change of power supply since the driving current is more than a necessary value if the buffer is used in a low speed operation system. On the contrary, in case of setting a driving current of the buffer rather lower in consideration with a low-speed operation system, there is some problem that delay time of buffer becomes too large if the buffer is used in a high speed operation system, where the system does not operate at a desired operational speed. Therefore, it is required to change driving current of a buffer to an adequate one when a load capacity connected to the buffer is not appropriate.

As a solution for such problems, there is a method proposed in a laid-open Japanese patent publication No. 6-311016. As shown in FIG. 22, the method supplies an appropriate load current to the load connected to terminal 16 by switching a switching circuit 18 by the control circuit 19 so that at least one of buffers (1)-(n) becomes conductive which is connected in parallel to a terminal 15 connected to CPU.

Although the output buffer circuit constructed described above may set and change a driving current by a signal from a control circuit, a complicated procedure for setting the number of output buffer circuit to be switched and a circuit diagram of control circuit. The procedure further is needed to consider maximum load capacity and minimum load capacity so that errors may not be occurred by a change of power sources and also an operation speed required in IC may be satisfied in the system.

It is common that delay time of the buffer defined on the semiconductor substrate varies by a voltage change of power source which supplies current to IC or by a temperature variation in an environment where IC is used. Therefore, in a conventional circuit shown in FIG. 22, there is a problem that delay time change is caused by temperature variation in an environment and then a signal input timing to an IC of next stage, which leads to a error of system.

Further, in the buffer circuit shown in FIG. 22, there is another problem that a big area is needed for forming a plurality of output buffer circuits on the surface of an IC.

It is an object of the present invention to provide an output buffer circuit which solves such problems. The buffer circuits, having driving current regulating function incorporated into an IC at a design stage, is controlled automatically and appropriately according to a load characteristics when an electronic equipment is used. The present invention can provide a small area buffer circuit on IC and also is hardly affected even if the load capacity is changed, even if an IC power supply is a multi-power supply type, or if power supply voltage and temperature varies.

SUMMARY OF THE INVENTION

According to one aspect of the invention, a buffer circuit with driving current adjusting function comprises a buffer circuit which is controlled by a control signal for supplying a most appropriate driving current to a load; a load detecting circuit for detecting a phase difference between an input signal and an output signal of the buffer circuit and for outputting voltage corresponding to the phase difference, a control signal generating circuit for generating a signal which controls the driving current of the buffer circuit in response to an output signal of the load detecting circuit, the control signal generating circuit controls the buffer circuit so that driving current may increase when delay time between input and output of the buffer circuit becomes long, and also controls the buffer circuit so that driving current may decrease when delay time between input and output of the buffer circuit becomes short.

According to another aspect of the invention, a buffer circuit with driving current adjusting function comprises a buffer circuit which is controlled by a control signal for supplying a most appropriate driving current to a load; a load detecting circuit for outputting logical signal having a plurality of bits obtained from rising edge waveform or falling edge waveform of output signal of the buffer circuit; a control signal generating circuit for generating a signal which controls the driving current of the buffer circuit in response to the plurality of bit, the control signal generating circuit generates more logical bits and then controls the buffer circuit so that driving current may increase when delay time between input and output of the buffer circuit becomes long, and also generates less logical bits and then controls the buffer circuit so that driving current may decrease when delay time between input and output of the buffer circuit becomes short.

According to also another aspect of the invention, a buffer circuit with driving current adjusting function, wherein the load detecting circuit comprises a phase difference detector and a counter circuit; the load detecting circuit comprises two sets of inverters having different operating points (threshold) and an XOR logical gate to which an output of each inverter is supplied and generates a pulse corresponding to a phase difference between two points of rising edge pulse wave or falling edge pulse wave of output signal of buffer circuit; the counter circuit counts pulse number detected in the phase difference detector and applies the most significant bit (MSB) of the counter to input terminals of respective flip- flops, and then the counter circuit outputs logical value "1" to any n-parallel output terminals of respective flip flop every time when MSB changes from "0" to "1".

According to further aspect of the invention, a buffer circuit with driving current adjusting function comprising; a buffer circuit which is controlled by a control signal for supplying a most appropriate driving current to a load; a load detecting circuit for generating a pulse signal according to phase difference between a signal which the input of the buffer circuit being delayed for a predetermined time and an output signal of the buffer circuit; and a control circuit which for outputting logical signal having a plurality of bits in response to the output pulse of the load detecting circuit, wherein when a phase difference becomes large between the signal which the input of the buffer circuit being delayed for a predetermined time and the output signal of the buffer circuit, the control circuit generates many logical bits and controls to cause the driving current of the buffer circuit to increase, and when the phase difference becomes small, the control circuit generates less logical bits and controls to cause the driving current of the buffer circuit to decrease.

According to another aspect of the invention, a buffer circuit with driving current adjusting function comprises an enable circuit which is controlled by an enable signal between an input-output signal and a load detecting circuit; the enable circuit controls the input and output signals to be applied to the load detecting circuit when the enable signal is either one of the logical signal (for example, logical value "1"), the enable circuit further controls to prevents the input and output signals to be applied to the load detecting circuit when the enable signal is the other logical signal (for example, logical value "0"), thereby a signal is not outputted from the load detecting circuit and driving current of the buffer circuit is fixed since logical signal value of a plurality of bits is fixed.

According to still another aspect of the invention, a buffer circuit with driving current adjusting function comprises a buffer circuit which is controlled by a control signal for supplying a most appropriate driving current to a load; a load detecting circuit for generating a pulse signal according to phase difference between a signal which the input of the buffer circuit being delayed for a predetermined time and an output signal of the buffer circuit; a counter circuit for counting pulse signal of the load detecting circuit and for outputting logical signal having a plurality of bits; and a driving current control signal generating circuit for generating a control signal which controls driving current of the buffer circuit in response to the logical signal having a plurally of bits, wherein when a phase difference becomes large between the signal which the input of the buffer circuit being delayed for a predetermined time and the output signal of the buffer circuit, the control circuit generates many logical bits and controls to cause the driving current of the buffer circuit to increase, and when the phase difference becomes small, the control circuit generates less logical bits and controls to cause the driving current of the buffer circuit to decrease.

According to another aspect of the invention, a buffer circuit with driving current adjusting function wherein the counter circuit comprises a counter and a plurality of flip flops, the counter digitally counts a phase difference between the input and output signal, the most significant bit (MSB) of the counter is inputted into input terminal of respective flip- flops and then logical value "1" is outputted to a parallel output terminals of one of n flip- flops every time when a counted value of the counter exceeds a predetermined threshold value assigned to each flip flop.

According to further aspect of the invention, a delay element, and a filter circuit comprised of capacity and resistor in the load detecting circuit are equipped at outside of the semiconductor IC.

BRIEF DESCRIPTION OF THE DRAWINGS

FIG. 12 shows a relationship between input pulse number and output bit logical value 1 in a counter circuit.

DETAILED DESCRIPTION OF THE PREFERRED EMBODIMENTS

Embodiment 1

Figure 1:
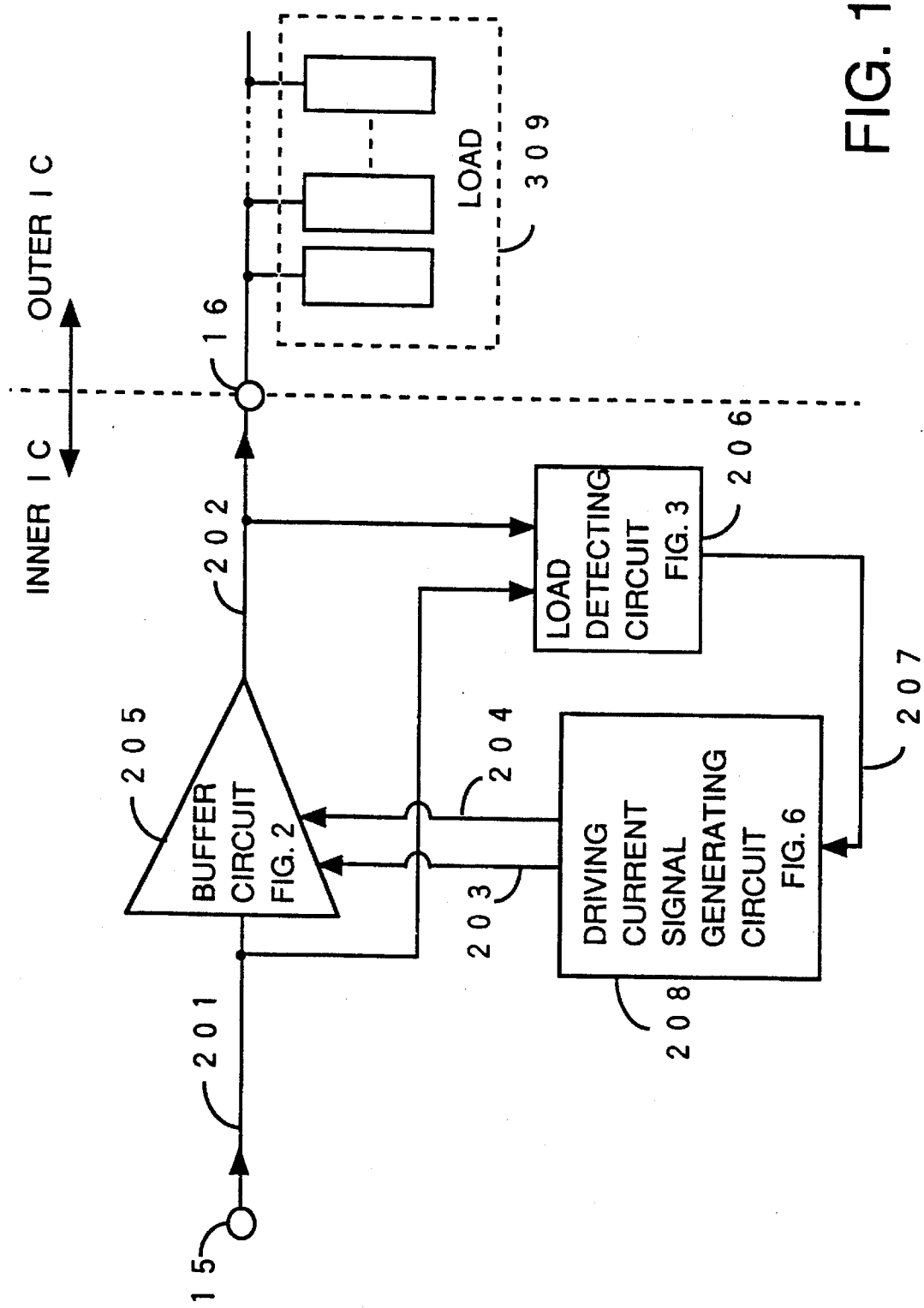
FIG. 1 shows a circuit diagram of a buffer circuit with driving current regulating function of a first embodiment of the present invention.

A first embodiment of the present invention is explained using FIG. 1. FIG. 1 shows a circuit diagram of a buffer circuit with a driving current regulating function of a first embodiment of the invention. In this circuit, a buffer circuit 205 is connected between an input terminal 15 and an output terminal 16. A signal outputted from an internal circuit of electronic equipment (not illustrated) is inputted to the input terminal 15 and the output of the buffer circuit 205 is supplied to a load of external circuit through the output terminal 16. Buffer circuit 205 is controlled by a load detecting circuit 206 and a driving current control signal generating circuit 208 provided inside the IC circuit. The control circuit comprises the load detecting circuit 206 and the driving current control signal generating circuit 208. The load detecting circuit 206 receives signals 201 and 202 and converts a phase difference between the signals 201 and 202 to a voltage as analog quantity and outputs it as a signal 207. The driving current control signal generating circuit 208 receives a signal 207 and generates driving current regulating signals 203 and 204 which correspond to the signal 207 and transmits them to the output buffer 205.

Figure 2:
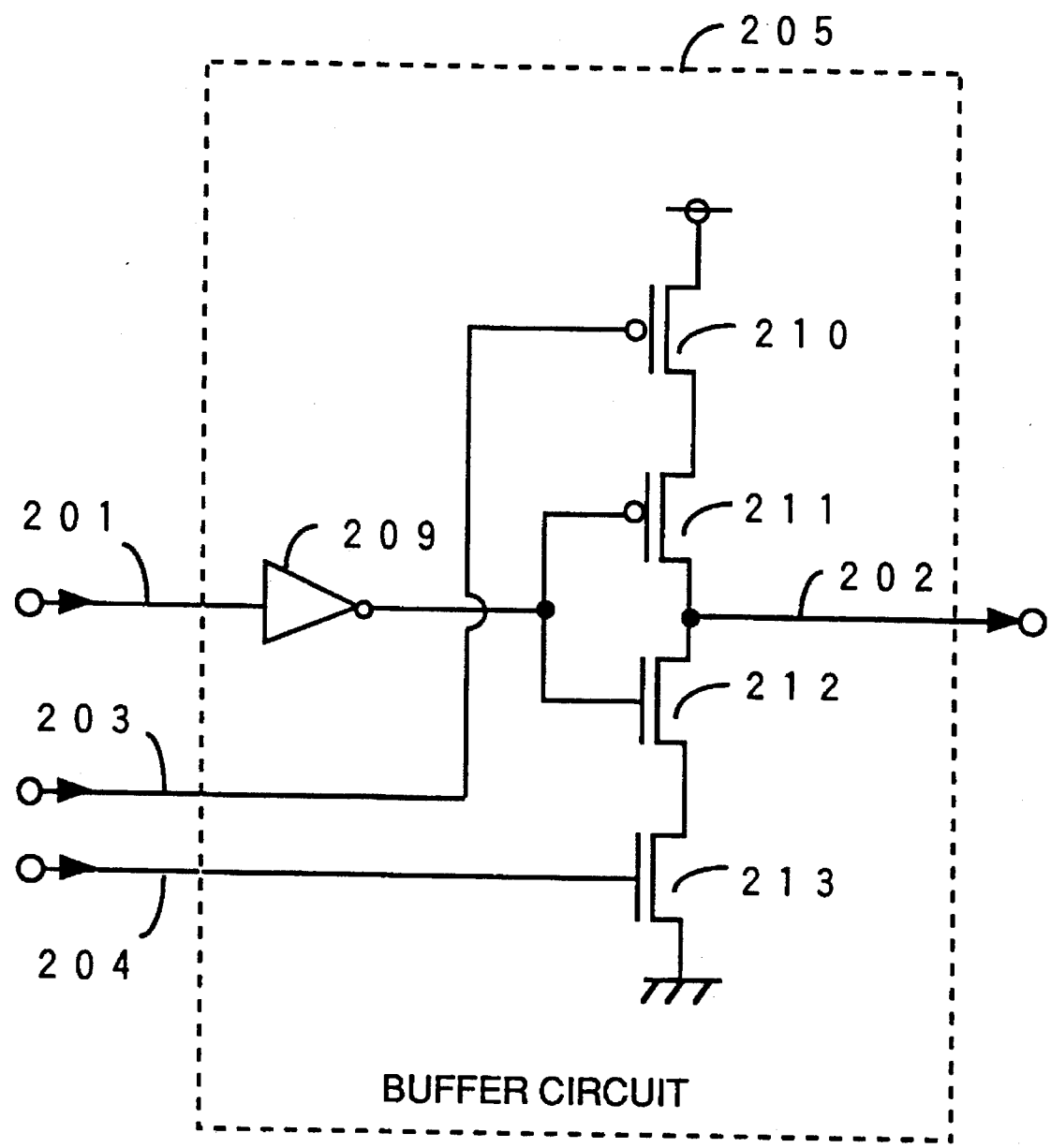
FIG. 2 shows a circuit diagram of a buffer circuit of a first embodiment of the present invention.

An operation of each circuit is explained as follows. FIG. 2 shows a circuit diagram of a buffer circuit 205. A buffer circuit 205 comprises a pre-driver 209 which is a CMOS inverter, P channel transistors 210, 211 and N channel transistors 212, 213. A pre-driver 209 inverts an inputted signal 201 and transmits it to P channel transistor 211 and to a gate of N channel transistor 212. P channel transistor 211 and N channel transistor 212 output an output signal 202 of a pre-driver 209. P channel transistor 210 and N channel transistor 213 control the currents which are outputted from P channel transistor 211 and N channel transistor 212, respectively. According to the present invention, current quantity which flows between P channel transistor 210 and N channel transistor 213 is controlled by voltages of signal 203 and 204, respectively, thereby the driving current which is supplied to a load and indicated by the signal 202 may be varied.

Figure 3:
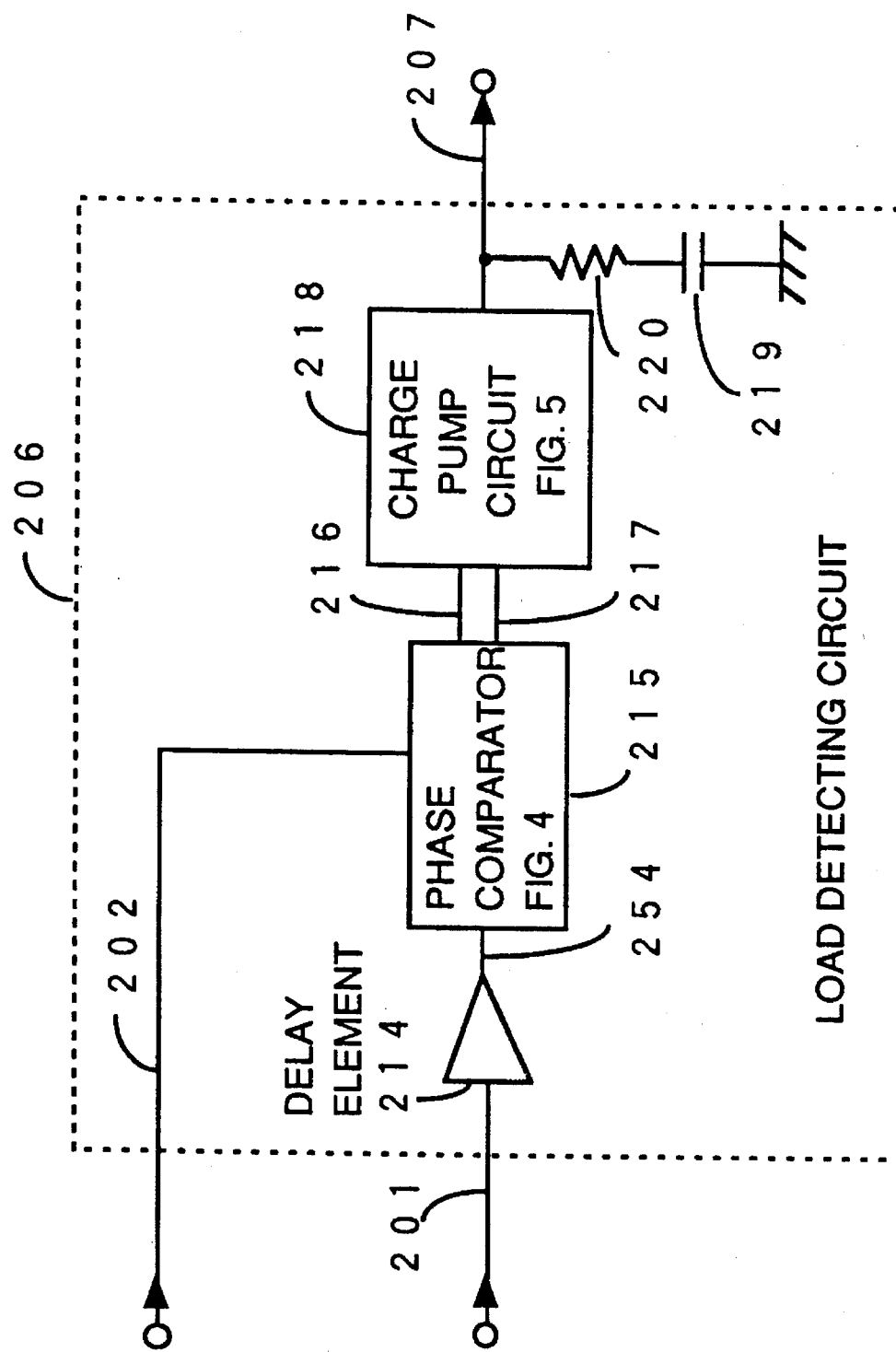
FIG. 3 shows a circuit diagram of a load detecting circuit of a first embodiment of the present invention.

FIG. 3 shows a circuit diagram of load detecting circuit 206. In FIG. 3, signals 201 and 202 input into a load detecting circuit. Signal 201 is delayed by a delay element 214 for a time almost equal to a delay time of the buffer circuit 205 and a signal 254 is supplied to a phase comparator 215. The phase comparator 215 outputs a pulse width which is the same as a phase difference of signals 202 and 254 as a signal 216 or a signal 217, respectively. A charge pump circuit 218 supplies a voltage signal 207 according to pulse signal 216 or 217. A filter comprised of a capacitor 219 and a resistor 220 prevents ringing of signal wave shape during charging and discharging the filter via signal 207.

In a construction of a first embodiment, when the delay time of the signal in the buffer circuit 205 between the signal 201, which is generated by the load, and the signal 202 in FIG. 1, is longer than the delay time of delay element 214, a pulse signal 216 having the same width as the phase difference between the signal 201 and the signal 202 is outputted. Thereby, a charge pump circuit 218 increases voltage of the signal 207 corresponding to an amount equal to the delay time from the signal 254 to the signal 202. On the other hand, when delay time from signal 201 to signal 202 in the buffer circuit 205 is shorter than the delay time of the delay element 214, a pulse signal 217 having the same width as the phase difference between the signal 201 and the signal 202 is outputted. Thereby, a charge pump circuit 218 decreases voltage of the signal 207 corresponding to an amount equal to the delay time from the signal 202 to the signal 254. In other words, a load detecting circuit 206 converts delay time from the signal 201 to the signal 202 in the buffer circuit 205 into a voltage and outputs it as a signal 207.

Figure 4:
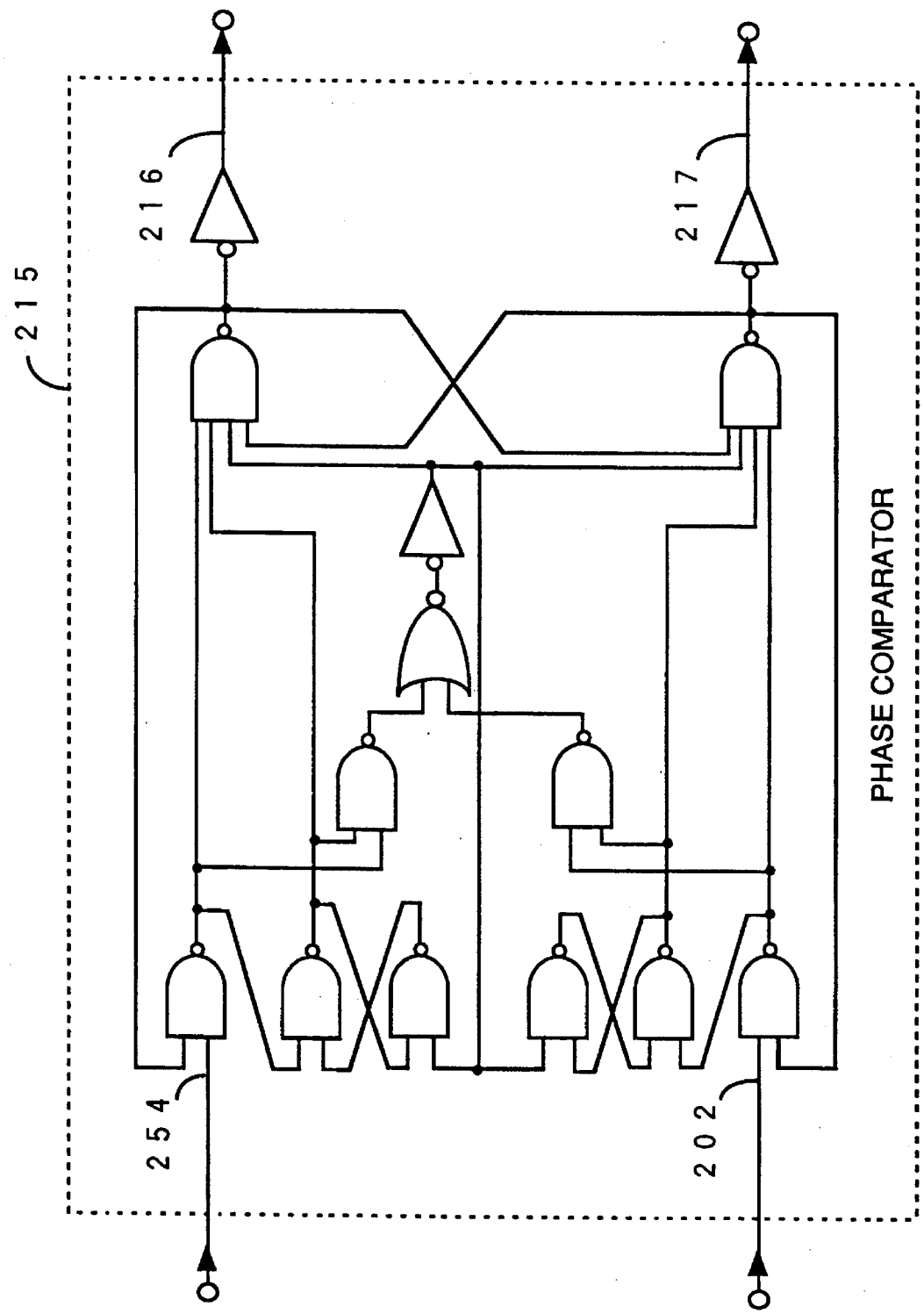
FIG. 4 shows a circuit diagram of a phase comparator of a first embodiment of the present invention.

Next, a further explanation is given on a phase comparator 215 in a load detecting circuit 206. FIG. 4 shows an example of the phase comparator 215. A phase comparator 215 compares phases of the signal 254 and the signal 202. If a phase of signal 202 is behind a phase of signal 254, a signal 216 having a pulse width in proportion to a phase difference between the signal 254 and the signal 202 is outputted. If a phase of signal 202 is advanced than a phase of signal 254, a signal 217 having a pulse width in proportion to a phase difference between the signal 254 and the signal 202 is outputted.

Figure 5:
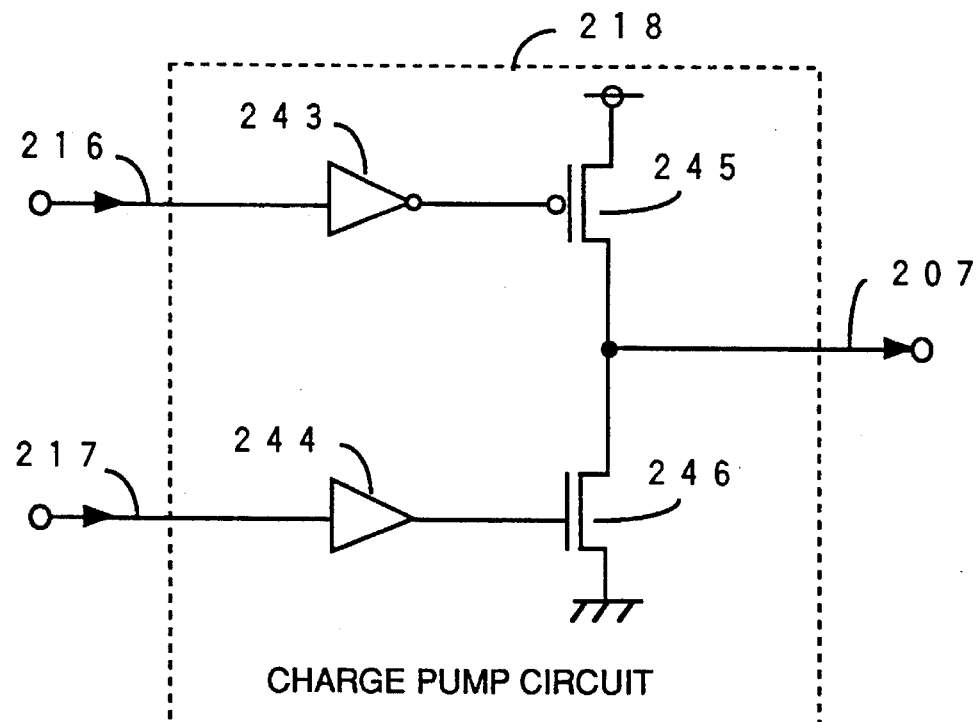
FIG. 5 shows a circuit diagram of a charge pump circuit of a first embodiment of the present invention.

FIG. 5 shows an example of a charge pump circuit 218 in FIG. 3. In charge pump circuit 218, a signal 216 is inputted into a gate of P channel transistor 245 through an inverter 243. On the other hand, a signal 217 is inputted into a gate of N channel transistor 246 through a driver 244. If the pulse signal 216 is inputted, an electric charge which is in proportion to the pulse signal width is supplied to signal 207 by P channel transistor 245 to raise the voltage of signal 207. On the other hand, if a pulse signal 217 is inputted, an electric charge which is in proportion to the pulse width of the signal 207 is discharged through N channel transistor 246 to lower the voltage of the signal 207. As described above, a charge pump circuit 218 decides the voltage of signal 207 by the pulse width of the signal 216 or the pulse width of the pulse signal 217.

Figure 6:
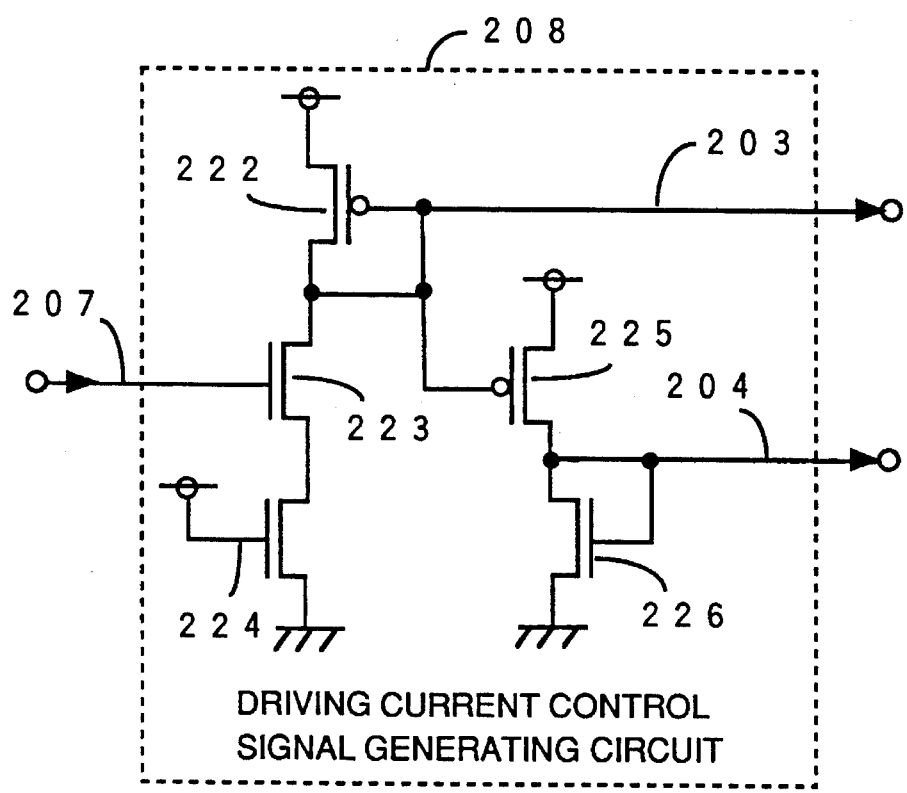
FIG. 6 shows a circuit diagram of a driving current control signal generating circuit of a first embodiment of the present invention.

FIG. 6 shows an example of a driving current control signal generating circuit 208 in FIG. 1. In FIG. 6, P channel transistors 222, 225 and N channel transistors 223, 224 and 226 comprises a current mirror circuit. A signal 207 is applied to a gate of N channel transistor 223. When the voltage of signal 207 rises, a current flowing between source and drain of N channel transistor 223 increases and the voltage of signal 203 falls. Further, since signal 203 is applied to a gate of P channel transistor 225, if a voltage of signal 203 falls, the current flowing between source and drain of P channel transistor 225 increases and a voltage of signal 204 raises. On the contrary, if the voltage of signal 207 falls, the voltage of signal 203 rises while the voltage of signal 204 falls down.

As is explained using FIGS. 1–5, if a load at the terminal 16 is large and the delay time of the buffer circuit 205 is longer than that of the delay element 214, the voltage of the signal 207 rises at the output of the load detecting circuit 206 while the voltage of signal 203 falls down and the voltage of signal 204 rises at the output of the driving current control generating circuit 208. As a result, a driving current which is supplied from the buffer circuit 205 to the load, which is connected to a terminal 16, increases.

If the load connected to the terminal 16 is small and delay time of the buffer circuit 205 is shorter than that of delay element 214, the voltage of signal 207 falls down at the output of the detecting circuit 206 and the voltage of signal 203 rises and the voltage of signal 204 falls down at the output of the driving current control generating circuit 208. As a result, a driving current which is supplied from the buffer circuit 205 to the load, which is connected to a terminal 16, decreases. Accordingly, in the system of the FIG. 1, the driving current of the buffer circuit is thus adjusted by feedback operation so that delay time from the signal 201 to the signal 202 in the buffer circuit 205 is always equal to that of the delay element 214.

Embodiment 2

Figure 7:
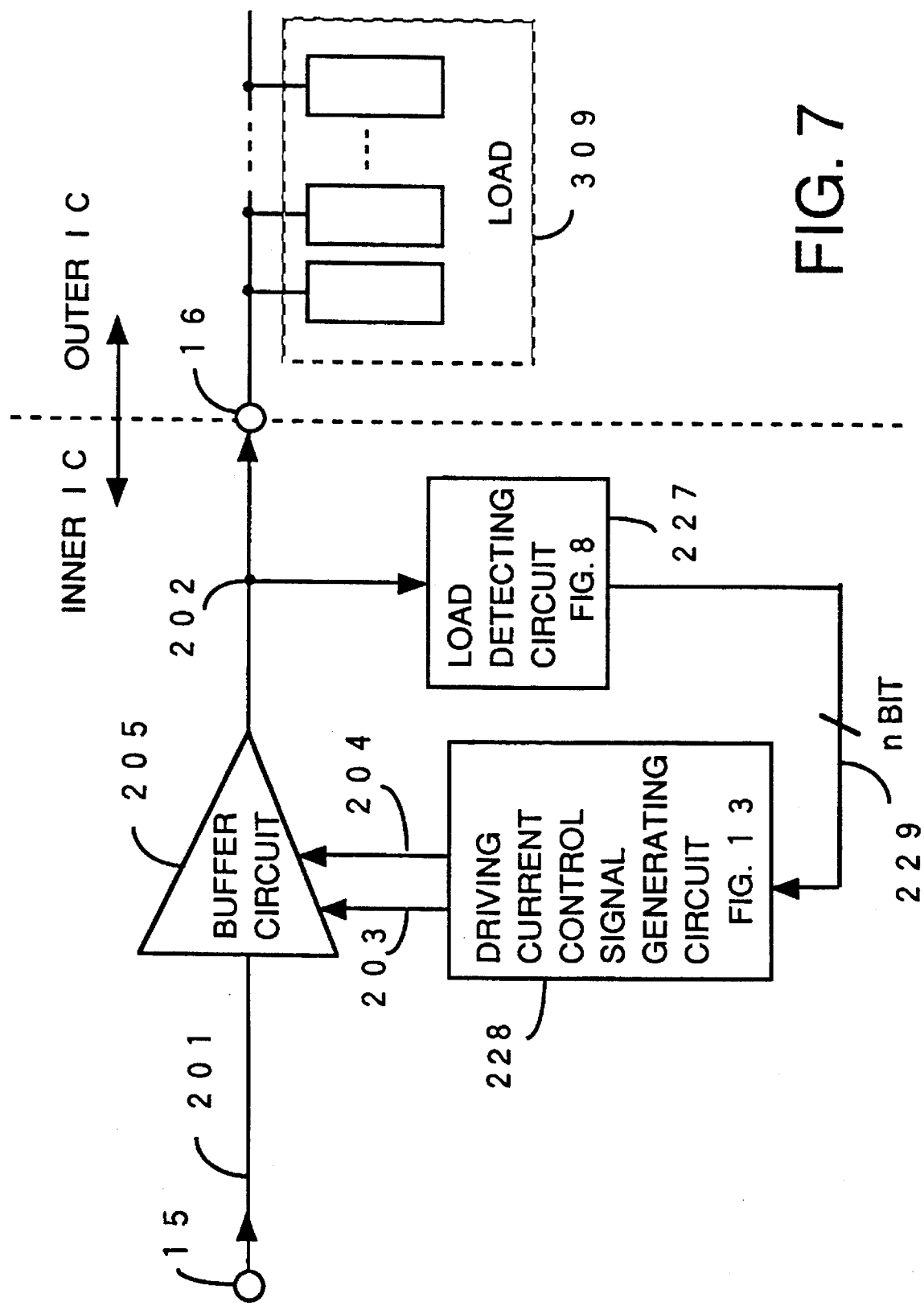
FIG. 7 shows a circuit diagram of a buffer circuit with driving current regulating function of a second embodiment of the present invention.

FIG. 7 shows a circuit diagram of buffer circuit with driving current regulation function of a second embodiment of the invention. In the circuit, a buffer circuit 205 is connected between the input terminal 15 and an output terminal 16. The input terminal 15 is connected to an internal circuit of electronic equipment (not illustrated) and an output terminal 16 is connected to a buffer circuit which supplies driving current to the load of external circuit. The buffer circuit with driving current regulation function comprises a detecting circuit 227 and a driving current control signal generating circuit 228 in IC. The detecting circuit 227 receives the signal 202 as input and converts a rising time or a falling time of the signal 202 to an n bit digital quantity and outputs it as signal 229. The driving current control signal generating circuit 228 receives a signal 229 as input and outputs the driving current control signals 203 and 204 corresponding to the signal 229. The buffer circuit 205 of the second embodiment has the same construction as the buffer circuit 205 of the first embodiment and carries out the same operation. The detailed description is therefore omitted.

Figure 8:
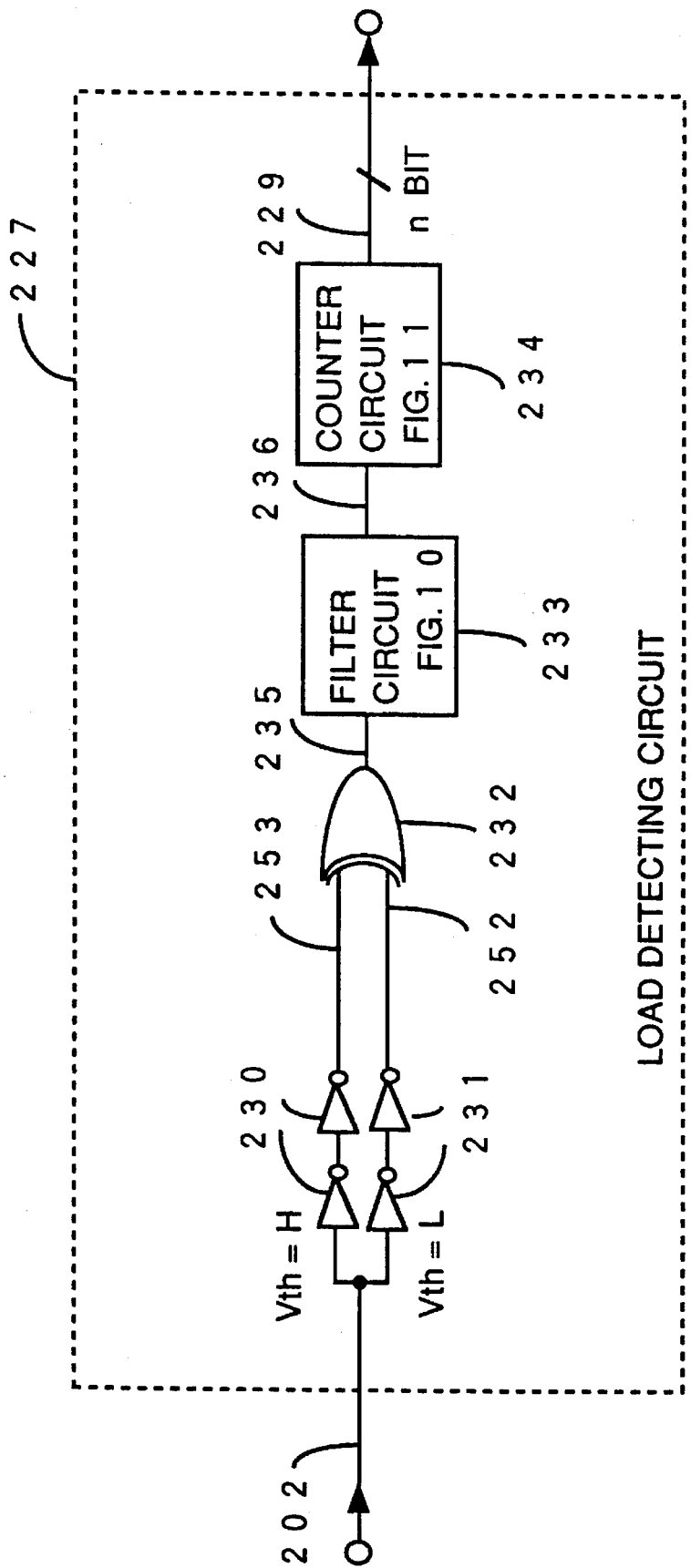
FIG. 8 shows a circuit diagram of a load detecting circuit of a second embodiment of the present invention.

FIG. 8 shows a circuit diagram of the load detecting circuit 227 of a second embodiment. In the load detecting circuit 227, the signal 202 is inputted into two kinds of CMOS inverters 230 and 231 which have different operating points (threshold), respectively. CMOS inverters 230 and 231 respectively have two stage serial inverters of the same characteristics. Output signals of CMOS inverters 230 and 231 are inputted into XOR logical gate 232. The output of XOR logical gate 232 is inputted into a filter circuit 233. Only the output pulses greater than a certain width is transmitted from filter circuit 233 to a counter circuit 234. The number of the output pulse is counted by counter circuit 234, the resultant number decides and maintains its output logic.

Figure 9:
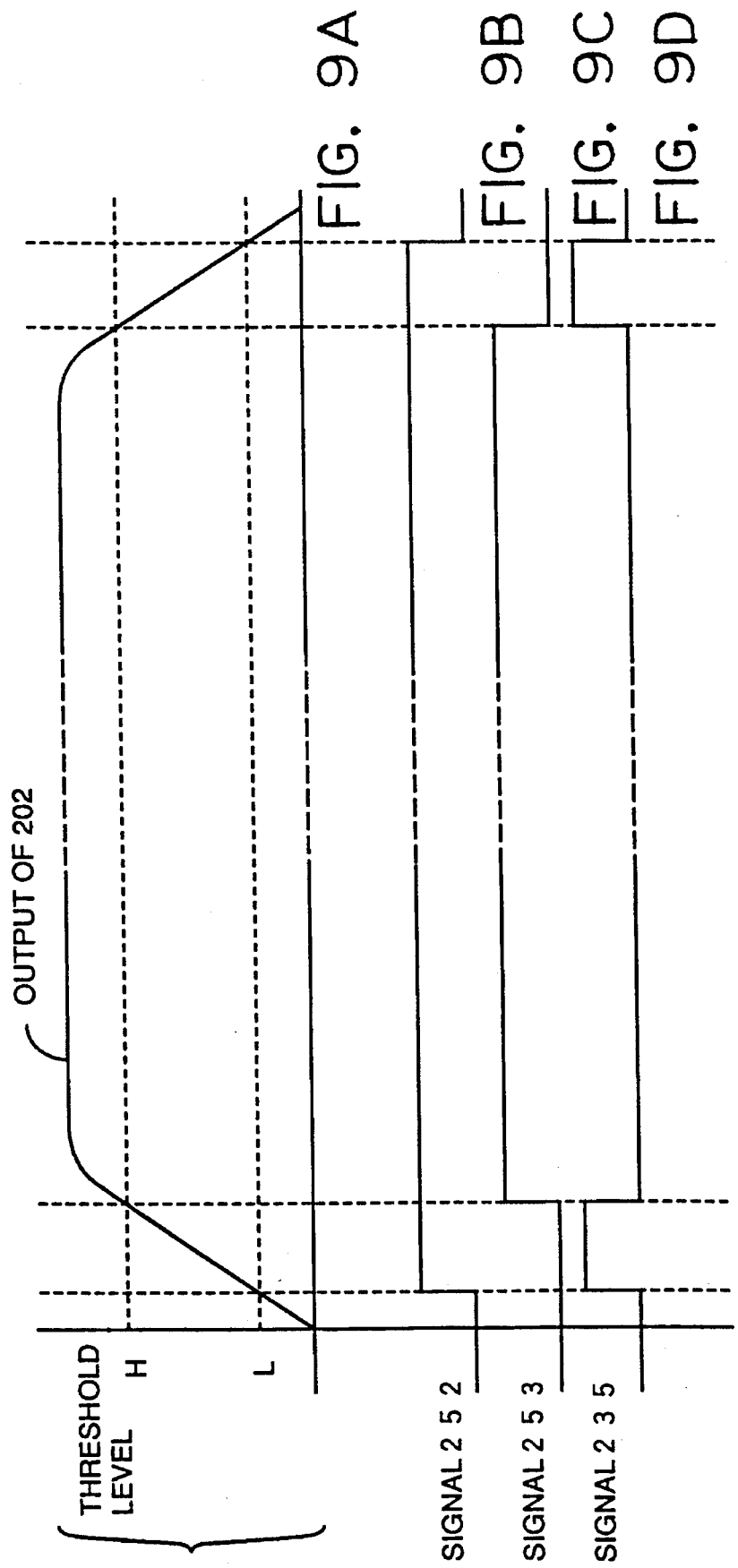
FIG. 9 shows a wave chart which explains a principle of load detection in a load detecting circuit of a second embodiment of the present invention.

FIG. 9 is a timing chart which explains a principle of detecting an amount of the load in the load detecting circuit 227 in FIG. 7. FIG. 9 (a) shows a changing state of rising and falling of wave shape of signal 202. Voltage waveform of the signal 202 is inputted to CMOS inverter 230 having a high threshold value (H) and to CMOS inverter 231 having a low threshold value (L). At the beginning CMOS inverter 231 monitors voltage of the signal 202 and outputs logical signal 252 when the voltage of signal 202 reaches "L" level at the rising edge of signal 202 as shown in FIG. 9 (b). Next, CMOS inverter 230 monitors voltage of the signal 202 and outputs logical signal 253 when the voltage of signal 202 further reaches "H" level at the rising edge of signal 202 as shown in FIG. 9 (c). When voltage (b) and (c) of FIG. 9 are inputted into XOR logical gate 232, pulse 235 is outputted as shown in (d) of FIG. 9, which is equal to the phase difference of outputs signal from CMOS inverters 230 and 231. The case where the signal 202 falls is also shown in FIG. 9. Its detailed explanation is omitted since the operation is the very same. This pulse is generated whenever the voltage of signal 202 changes, that is, every time load current changes.

Figure 10:
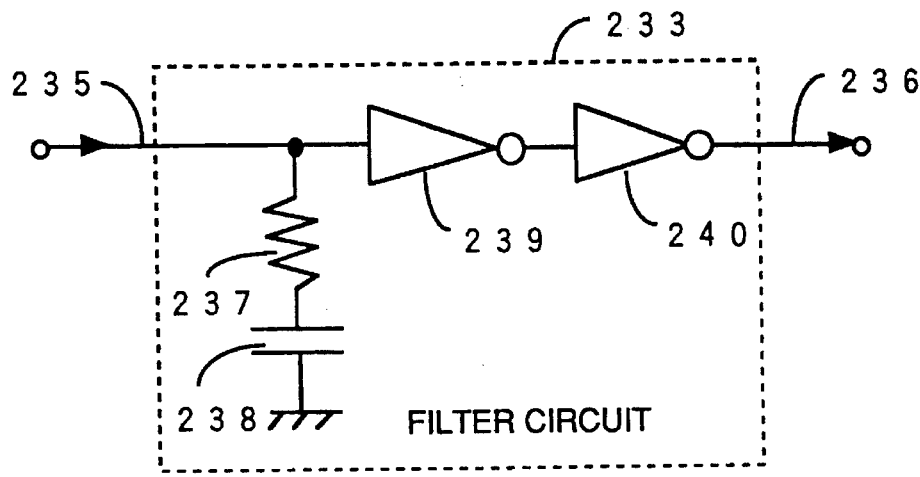
FIG. 10 shows a circuit diagram of a filter circuit of a second embodiment of the present invention.

The filter 233 and the counter circuit 234 in FIG. 8 are equipped in order to detect the pulse number at the output of the XOR logical gate 232. FIG. 10 shows an example of a filter circuit 233. In filter circuit 233, a signal 235 is applied to a series circuit consisted of a capacitor 238 and a resistor 237, where one end of the capacitor is grounded. The signal 235 is further applied to a series circuit of two CMOS inverters 239 and 240 connected in series. The filter circuit 233 allows the input signal 235 to pass through as a pulse signal 236 when a pulse width of the input pulse signal 235 is wider than a predetermined value by regulating a threshold value of CMOS inverter 239. When the pulse width of the input pulse 235 is narrower than a predetermined value, the input pulse signal 235 can not be allowed to pass through the CMOS inverter 239.

Figure 11:
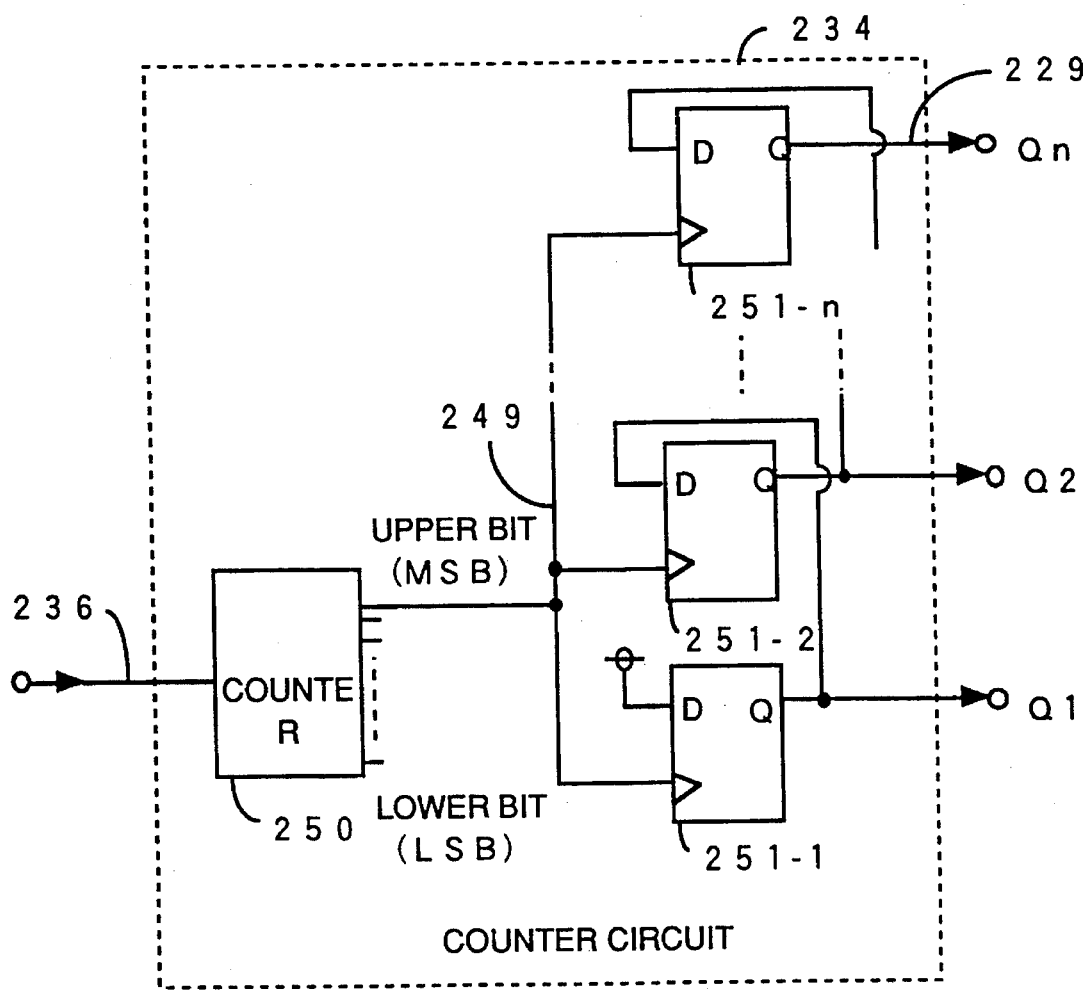
FIG. 11 shows a circuit diagram of a counter circuit of a second embodiment of the present invention.

FIG. 11 shows an example of a counter circuit 234 in FIG. 8. In the counter circuit 234 comprises a counter 250 and n flip flops 251-1~251-n. The pulse signal 236 is inputted into a counter 250. The most significant bit (MSB) outputted from the counter 250 is inputted into clock inputs of respective n flip flops 251-1~251-n. N bit signals 229 are outputted from Q1 to Qn according to the number of pulses included in the pulse signal 236.

FIG. 12 shows logical relation of the count number of the signal 236 and output signals 229 from Q1 to Qn. In FIG. 12, m denotes the number of pulses of the pulse signal 236, Th (1) denotes a first threshold value where a logical value "1" appears in MSB of counter 250, Th (2) denotes a second threshold value where a logical value "1" appears at the output of flip flop 251-1, and similarly, Th (n-1) denotes a (n-1)th threshold value where a logical value "1" appears at the output of flip flop 251-n.

For example, assuming Th (1) is 4, Th (2) is 8, Th (3) is 12 and so on. When the pulse number m of signal 236 reaches 4, the logical value "1" appears at MSB terminal of counter 250, which changes the logical value Q1 at flip flop 25 1-1 to "1". Next, when the pulse number m reaches 8 {=Th (2)}, the logical value "1" appears again at MSB terminal of counter 250, which changes the logical value Q2 at flip flop 251-2 to "1". Similarly, when the pulse number m reaches 12 {=Th (3)}, the logical value "1" appears for the third time at MSB terminal of counter 250, which changes the logical value Q3 of flip 251-3 to "1". As the pulse numbers m increase, the logical value "1" appears from Q1 to Qn terminals of flip flop 251-1~251-n one after another, respectively.

Figure 13:
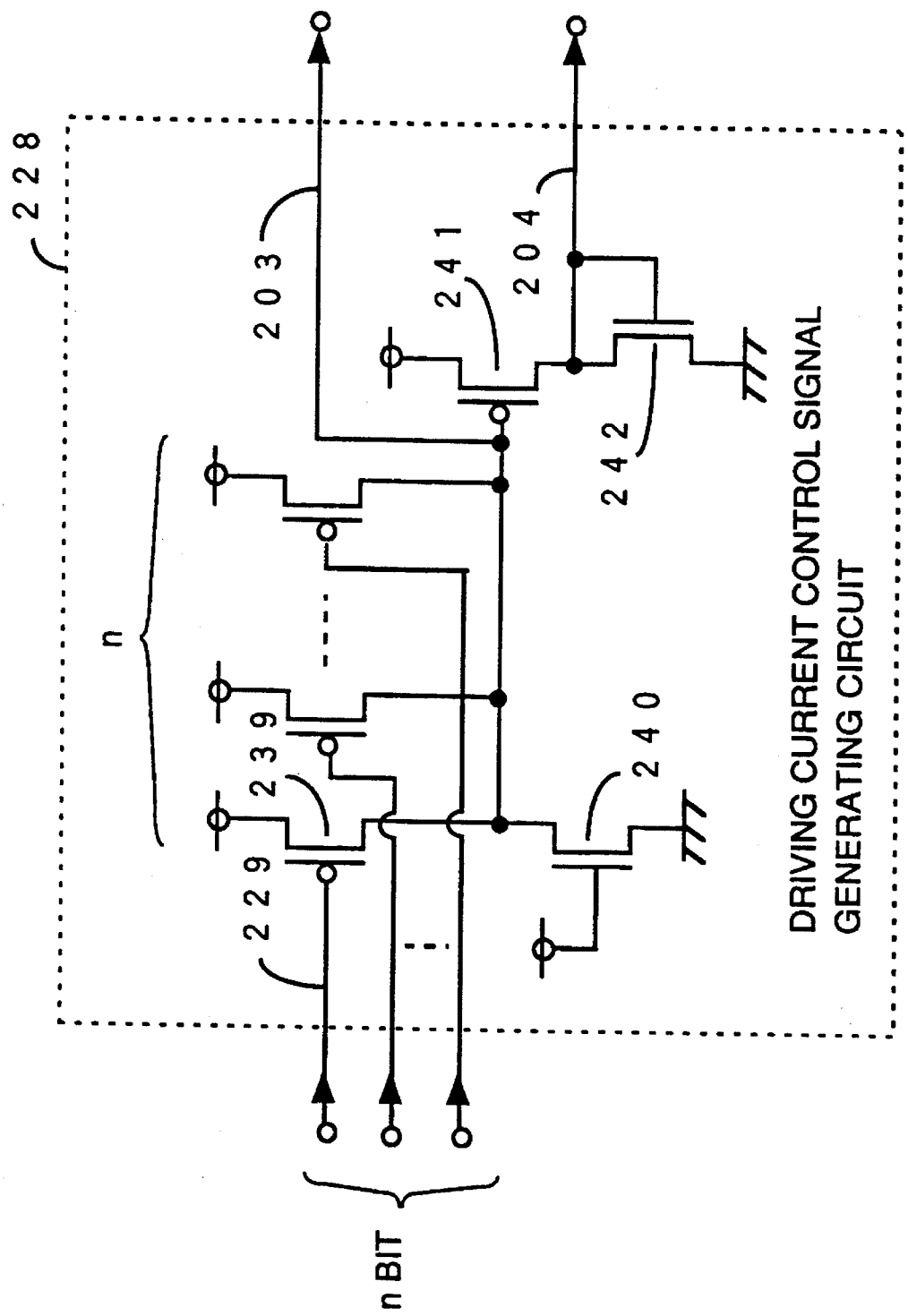
FIG. 13 shows a circuit diagram of a driving current control signal generating circuit of a second embodiment of the present invention.

FIG. 13 shows an example of driving current control signal generating circuit 228 in FIG. 7. In the driving current control signal generating circuit 228, n bits parallel signals which are generated in the load detecting circuit 227 are inputted into gates of P channel transistors 239, respectively. The numbers n of P channel transistors 239 and N channel transistor 240 defines a current mirror circuit together with P channel transistor 241 and N channel transistor 242. In the driving current control signal generating circuit 228, when n bits of signals 229 are occupied with a lot of logical values "0", a number of P channel transistors 239 becomes ON state corresponding to logical "0", which allows the total current flow through source-drain of P channel transistor 239 to increase. Therefore, the voltage of signal 203 rises. Also, since a signal 203 is applied to a gate of P channel transistor 241, the current flowing through the source-drain of P channel transistor 241 decreases and then the voltage of signal 204 drops down accordingly. On the contrary, when n bits of signals 229 are occupied with a lot of logical values "1", the voltage of signal 203 drops down and the voltage of signal 204 rises.

In the second embodiment of the present invention, as same as the first embodiment, the output signal of the load detecting circuit 227 is fed back to the buffer circuit 205 through the driving current control signal generating circuit 228 to automatically adjust the driving current. Accordingly, the driving current in the buffer circuit 205 increases when the pulse numbers of the pulse signal 236 increase. When the driving current increases, the delay time shortens and then the pulse width becomes narrower. The filter circuit 233 is equipped to prevent a pulse signal to be transmitted, which having a width narrower than a predetermined pulse width which corresponds to a desired rising time or falling time of signal 235. Thus, the logic value (output) of signal 229 is fixed at a certain value at the point where rising time or falling time of signal 202 reaches the predetermined value.

As explained with FIGS. 7 to 13, when load connected to the output terminal 16 is large and when the rising time or falling time of the output signal of the buffer circuit 205 is therefore longer than a predetermined values, the logical value "1" in the n bit-signal 229 increases at the output of the load detecting circuit 227. Therefore, the voltage of signal 203 falls down and the voltage of signal 204 rises at the driving current control signal generating circuit 228, which causes the driving current of buffer circuit 205 to increase. The operation is repeated by the filter circuit 233 until the rising time or falling time of output signal in buffer circuit 205 becomes the desired value, that is, until the logic of signal 229 is fixed to a certain value. Accordingly, the driving current of buffer circuit 205 is thus adjusted automatically.

Embodiment 3

Figure 14:
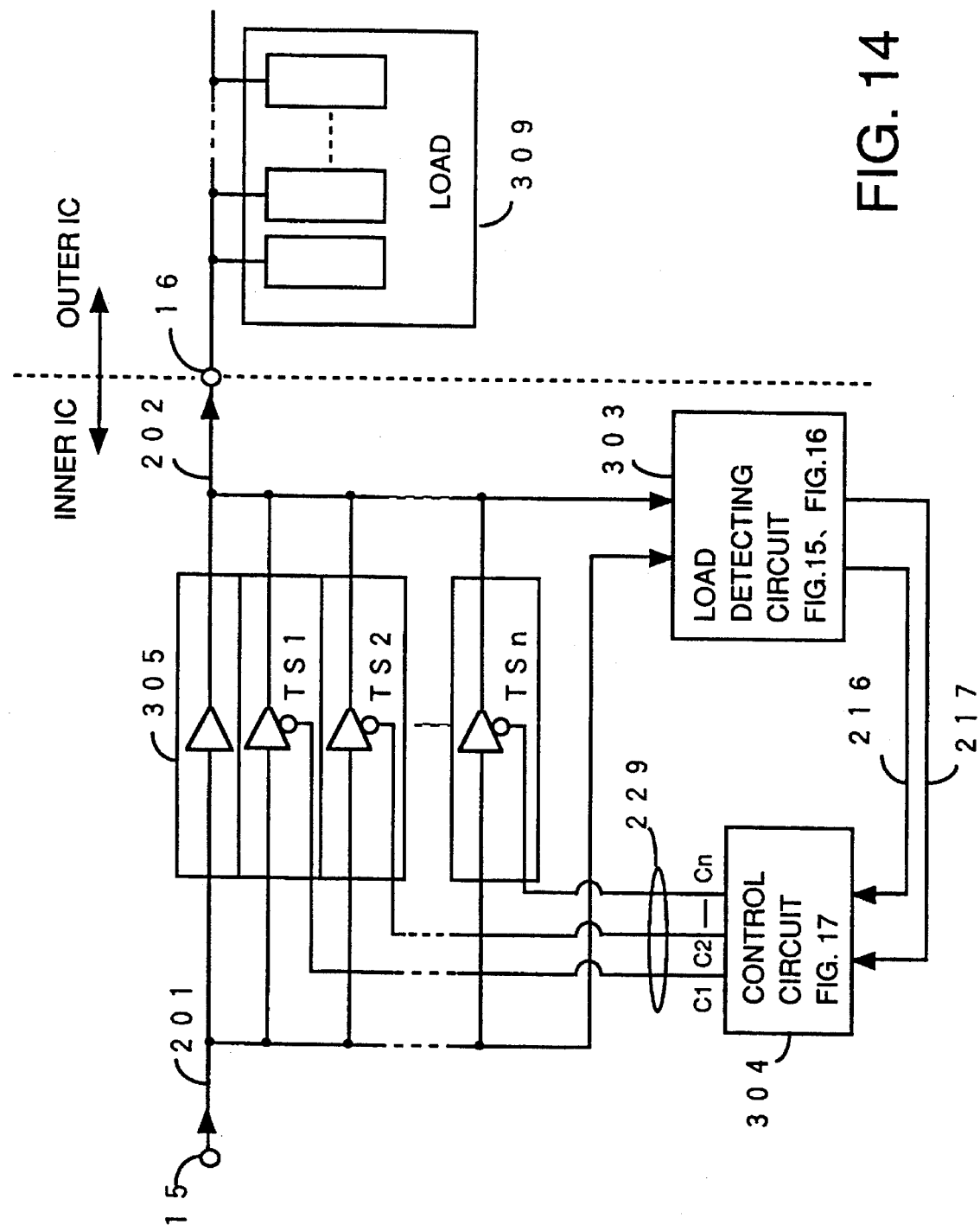
FIG. 14 shows a circuit diagram of a buffer circuit with driving current regulating function of a third embodiment of the present invention.

FIG. 14 shows a circuit diagram of a buffer circuit with driving current regulation function in a third embodiment of the invention. A buffer circuit 305 is connected between an input terminal 15 and an output terminal 16. The input terminal 15 is connected to an internal circuit of electronic equipment (not illustrated) and an output terminal 16 is connected to a buffer circuit which supplies driving current to the load of external circuit. Further, the circuit of the third embodiment comprises a load detecting circuit 303 and a control circuit 304. The load detecting circuit 303 outputs pulses corresponding to the phase difference of the output signal 202 and the input signal 201 as a signal 216 and a signal 217, respectively. The control circuit 304 outputs signals 229 for controlling the driving current of buffer circuit 305 in response to the signals 216 and 217. The buffer circuit 305 comprises a buffer which is constantly active and a plurality of tri-state buffers TS1 to TSn, which are of the same driving current.

Figure 15:
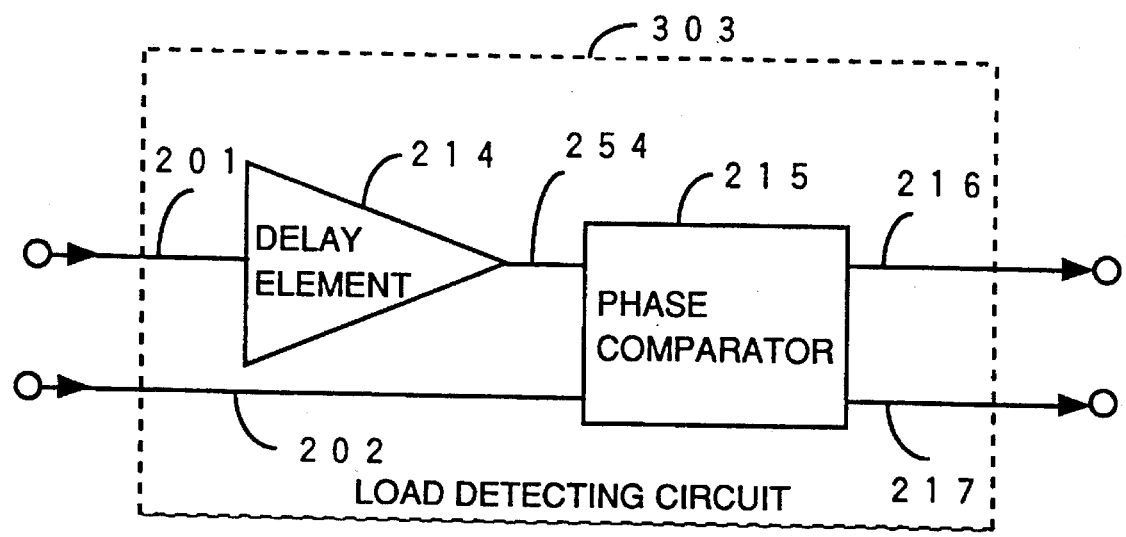
FIG. 15 shows a circuit diagram of a load detecting circuit of a third embodiment of the present invention.

FIG. 15 shows an example of load detecting circuit 303 in FIG. 14. The load detecting circuit 303 comprises a delay element 214 and a phase comparator 215. The delay element 214 causes a signal 201 putted into input terminal 15 to be delayed by a predetermined time, and the phase comparator 215 compares the phase of the signal 254 which is delayed by a delay element 214 with the signal 202 outputted from output terminal 16. The phase comparator 215 is of the same construction and operation as those of the phase comparator 215 used in the detecting circuit of FIG. 3. In FIG. 15, the signal 254 is a reference signal which is delayed for a predetermined time from the signal 201 which is inputted from input terminal 15. The load detecting circuit 303 in FIG. 15 outputs a pulse 216 when a phase of signal 202 is behind than that of the reference signal 254, and output pulse 217 when a phase of signal 202 is ahead than that of the reference signal 254.

Figure 16:
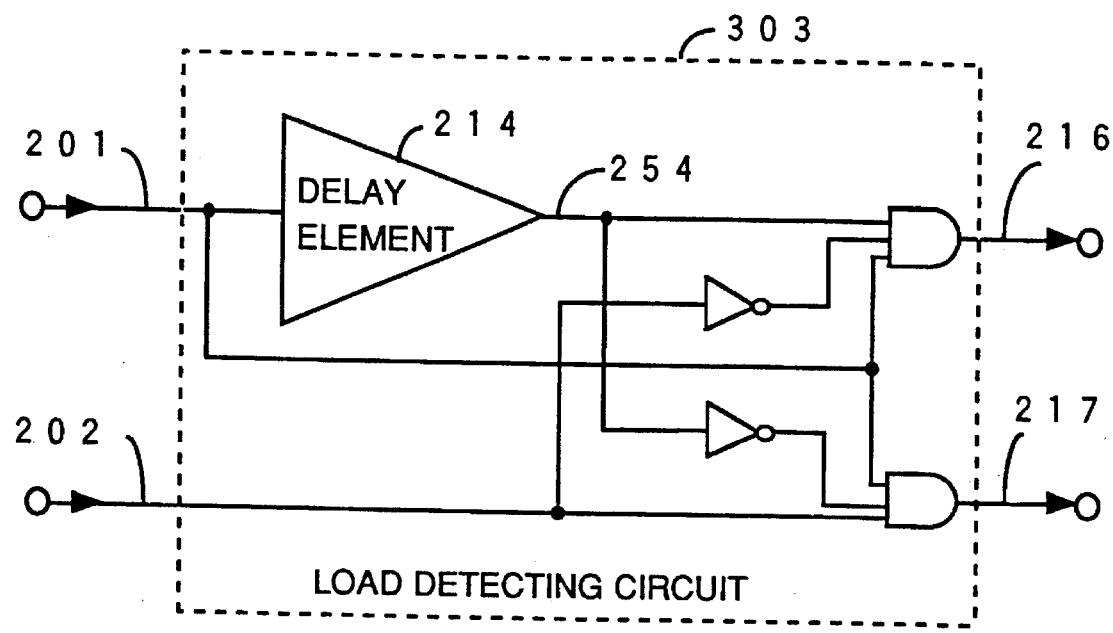
FIG. 16 shows a second circuit of a load detecting circuit of a third embodiment of the present invention.

FIG. 16 shows another embodiment of load detecting circuit 303. In FIG. 16, a signal 201 is applied to a delay element 214 as well as to an common input point of AND circuit. On the other hand, an output 254 of delay element 214 is inputted directly to a first AND circuit and also to a second AND circuit through an inverter. Also, a signal 202 is inputted directly to a second AND circuit and also to a first AND circuit through an inverter. The operation is the same as that of shown in FIG. 15. When a phase of the signal 202 is behind that of the signal 254, a pulse signal 216 is outputted from the first AND circuit and when a phase of signal 202 is ahead that of the signal 254, a pulse signal 217 is outputted from the second AND circuit.

Figure 17:
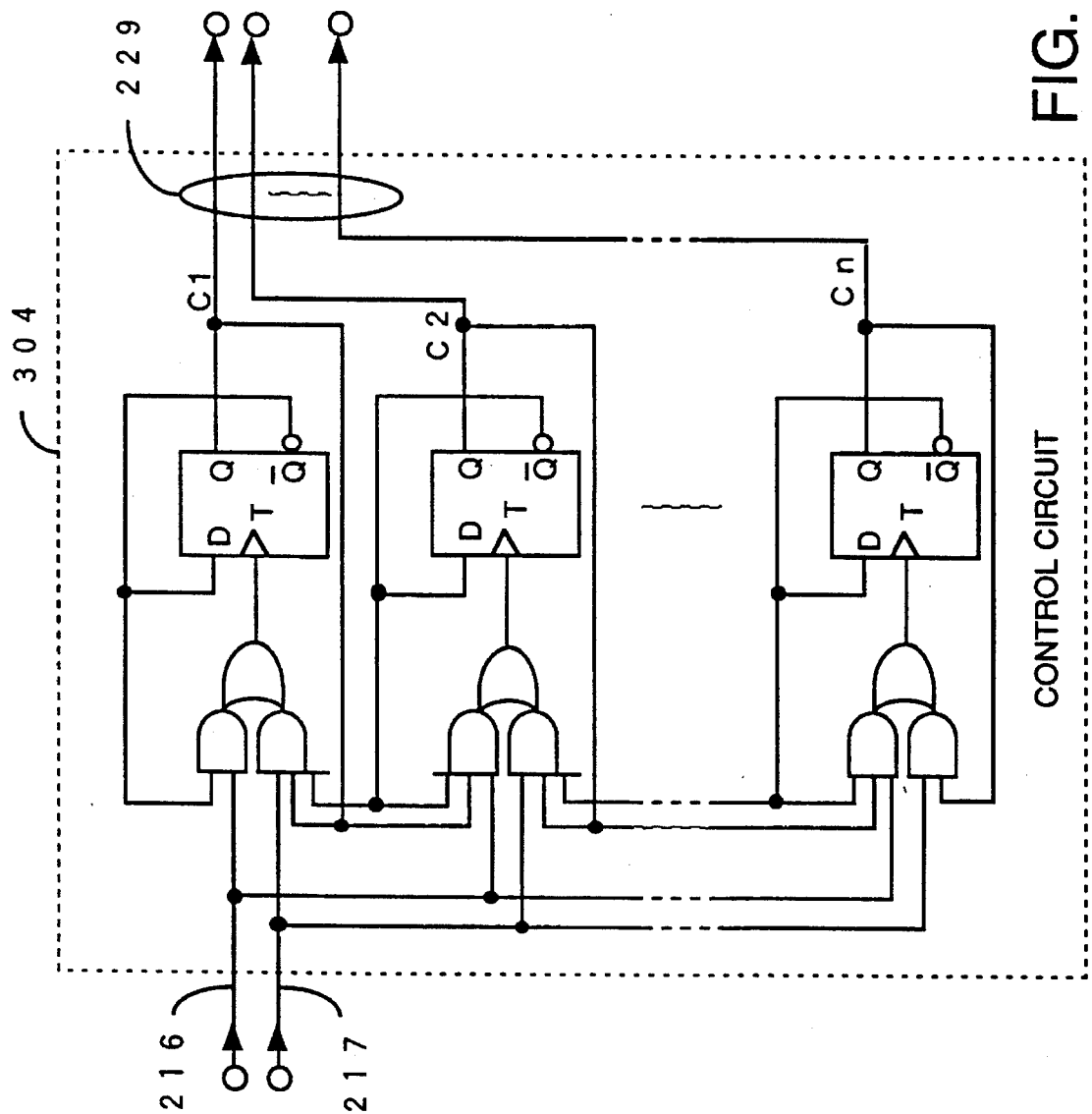
FIG. 17 shows a circuit of a control circuit of a third embodiment of the present invention.

FIG. 17 shows an example of control circuit 304 in FIG. 14. The control circuit 304 comprises an n bit shift register, which is sifted up by a pulse of signal 216 and is shifted down by a pulse of signal 217. The content of the register is outputted as signals 229. According to a state of n bit signals 229 which is outputted from the control circuit 304, each tri-state buffer TS1~TSn are switched to an active or a disable state. The current which is supplied to the load is increased by increasing the number of tri-state buffers which are turned active.

According to such construction, a third embodiment of the invention operates as follows. When an amount of load 309 which is connected to the output terminal 16 is large and then the delay time of the output signal 202 of the buffer circuit 305 is longer than the delay time of the signal from delay element 214, a pulse 216 is outputted from the load detecting circuit 303. The control circuit 304 causes the number of the logical value "1" of n bit signal 229 to increases by one. Thereby, the active state elements in the tri-state buffer TS1~TSn of the buffer circuit 305 increases by one which causes the driving current to increase.

When an amount of load 309 which is connected to the output terminal 16 is small and then the delay time of the output signal 202 of the buffer circuit 305 is shorter than the delay time of the signal from delay element 214, a pulse 217 is outputted from the load detecting circuit 303. The control circuit 304 causes the number of the logical value "0" of n bit signal 229 to decrease by one. Thereby, the active state elements in the tri-state buffer TS1~TSn of the buffer circuit 305 decreases by one which causes the driving current to decrease. Finally, driving current of buffer circuit 305 is adjusted so that delay time of the buffer circuit 305, which is from signal 201 to signal 202, is always the same as the delay time of the delay element 214.

Embodiment 4

Figure 18:
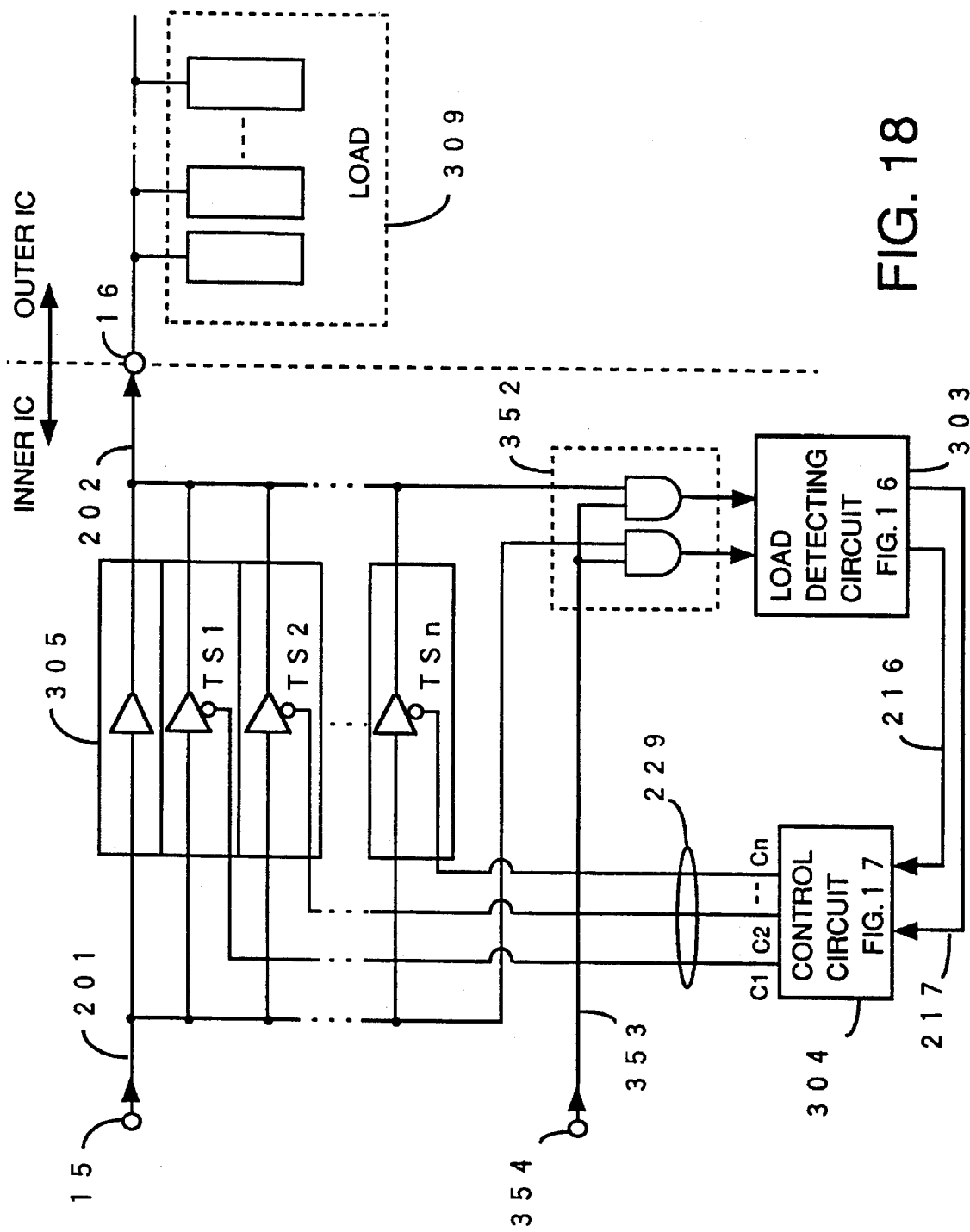
FIG. 18 shows a circuit diagram of a buffer circuit with driving current regulating function of a fourth embodiment of the present invention.

FIG. 18 shows a circuit diagram of buffer circuit with driving current regulation function of a fourth embodiment of the invention. The fourth embodiment differs from the third embodiment in that an enable circuit 352 is provided between the signals 201,202 and the load detecting circuit 303. In the third embodiment, the driving current of buffer circuit 305 changes by a unit of tri-state buffer between the minimum driving current and maximum driving current which are set at a design stage. When the delay time of delay element 214 exists between the delay time of the buffer circuit 305 having s active tri-state buffers (0≦s<n) and the delay time of the buffer circuit 305 having (s+1) active tri-state buffers, the stable driving current is not obtained since increase and decrease of driving current is repeated in the buffer circuit 305 during operation. Even when delay time of the buffer circuit 305 is the same as delay time of the delay element 214 and then the driving current is stable, there occurs some cases where noise is superposed to the signal 202. In this case, the load detecting circuit 303 sometimes erroneously operates which causes the driving current to change instantaneously, which prevents a stable driving current output. To solve such a problem, this fourth embodiment is provided with an enable circuit 352 which controls to prevent the signals 201 and 202 from being sent to the load detecting circuit 303 by an enable signal 353 which is inputted into an enable terminal 354.

The enable circuit 352 sends the signals 201 and 202 to the load detecting circuit 303 as they are when the enable signal 353 is logical value "1" and always sends "0" to the load detecting circuit 303 when the enable signal 353 is logical value "0". With such a construction, the fourth embodiment operates as same as the third embodiment when the enable signal 353 is logical value "1". On the other hand when the enable signal is logical value "0", a signal inputted into load detecting circuit 303 is always "0" and pulse signals 216 and 217 are not outputted to the control circuit 304 from the load detecting circuit 303. Since the pulse signals are not inputted to the control circuit 304 through the signals 216 and 217, the logical value of the output signals 229 is fixed at a certain value and the driving current of the buffer circuit 305 is fixed at constant value. Therefore, when the enable signal 353 is changed from logical value "1" to "0", the driving current of buffer 305 is fixed. Accordingly, the buffer circuit 305 outputs a stable driving current which is not affected by noise.

Embodiment 5

Figure 19:
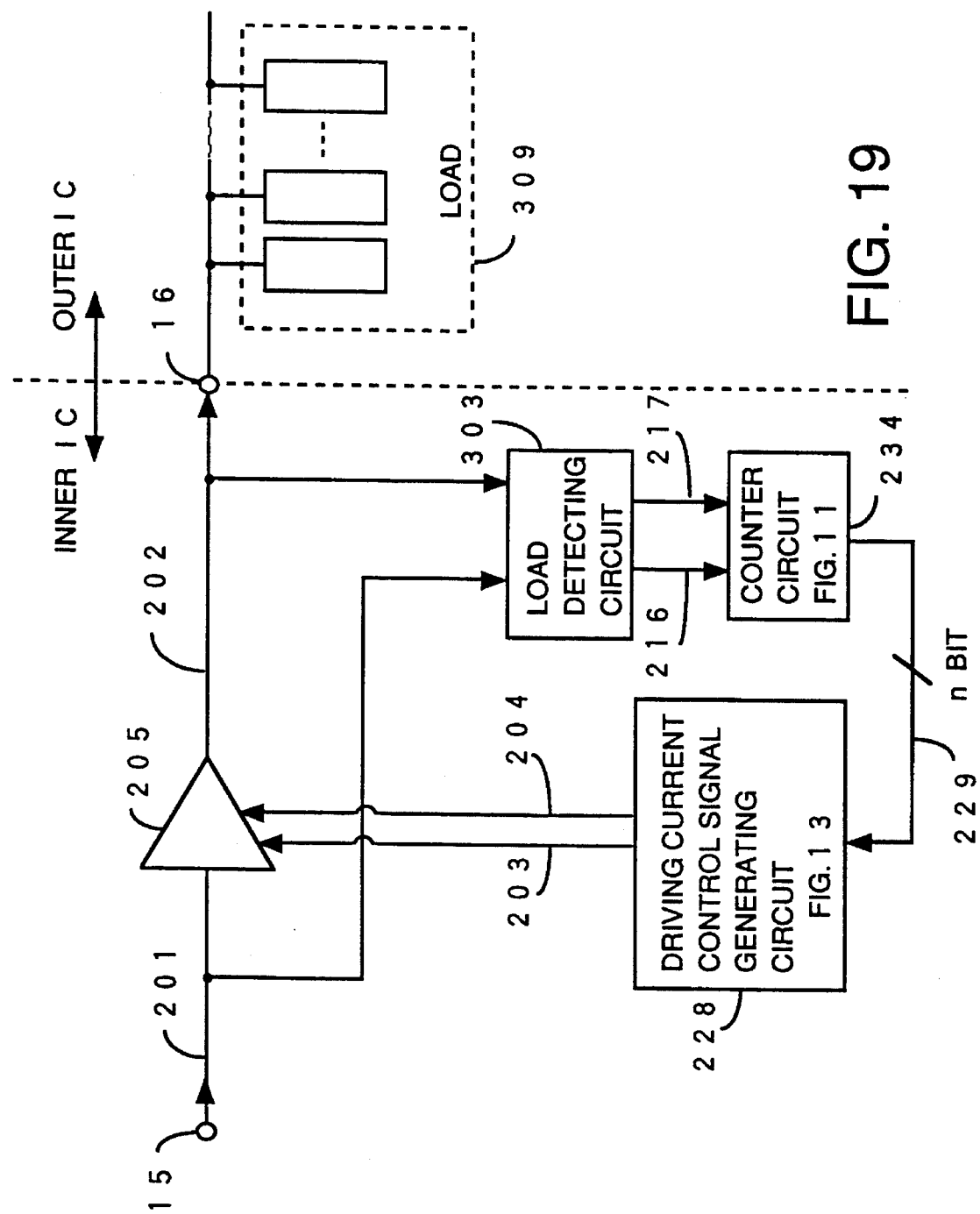
FIG. 19 shows a circuit diagram of a buffer circuit with driving current regulating function of a fifth embodiment of the present invention.

FIG. 19 shows a circuit diagram of a buffer circuit with driving current regulation function in a fifth embodiment of the invention. In the second embodiment shown in FIG. 7, the load detecting circuit 227 converts the falling time and rising time of the output signal 202 into n-bit digital quantity and outputs it to the signal 229. On the other hand, in the fifth embodiment of the present invention, the load detecting circuit 227 comprises a load detecting circuit 303 and a counting circuit 234 and converts a phase difference between the input signal 201 and output signal 202 into n-bit digital quantity and outputs it to the signal 229. The load detecting circuit 303 of this fourth embodiment is of the same construction and operation with the load detecting circuit 303 of the third embodiment and the counter circuit 234 is of the same construction and operation with the counter circuit 234 of FIG. 8.

The fifth embodiment of such circuit construction operates as follows. When an amount of load 309 which is connected to the output terminal 16 is large and then the delay time of the output signal 202 of the buffer circuit 305 is longer than the delay time of the signal from delay element 214, a pulse 216 is outputted from the load detecting circuit 303. The control circuit 304 causes the number of the logical value "1" of n bit signal 229 to increases by one. Thereby, the driving current control generating circuit 228 lowers the voltage of signal 203 and raises the voltage of signal 204, which increases the driving current of the buffer circuit 205. The operation is repeated until delay time of the output signal 202 of the buffer circuit 305 becomes shorter than delay time of the delay element 214 and then until logical output of the signal 229 is finally fixed at certain value. Accordingly, the driving current of buffer circuit 205 is thus adjusted automatically.

Embodiment 6

Figure 20:
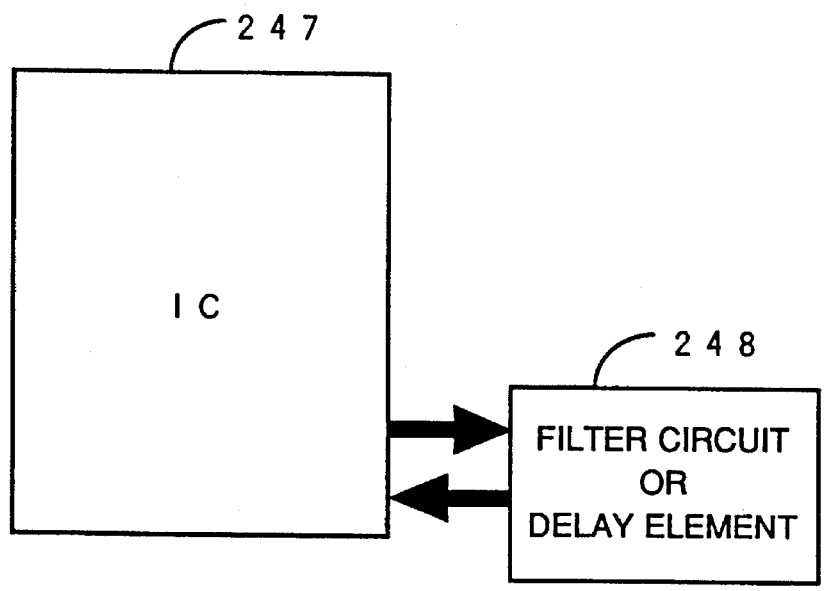
FIG. 20 shows a circuit diagram of a buffer circuit with driving current regulating function of a sixth embodiment of the present invention.
Figure 21:
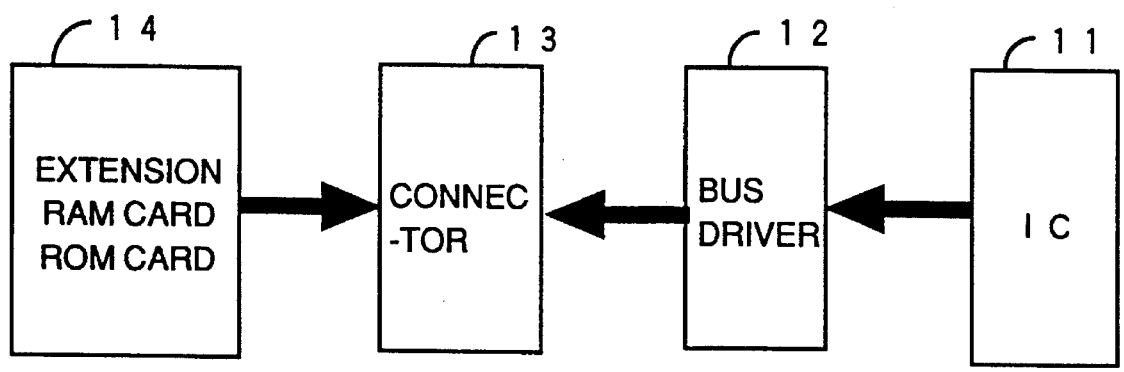
FIG. 21 shows a connection when adding a plurality of extensions to an IC apparatus using a conventional buffer driving current switching circuit.
Figure 22:
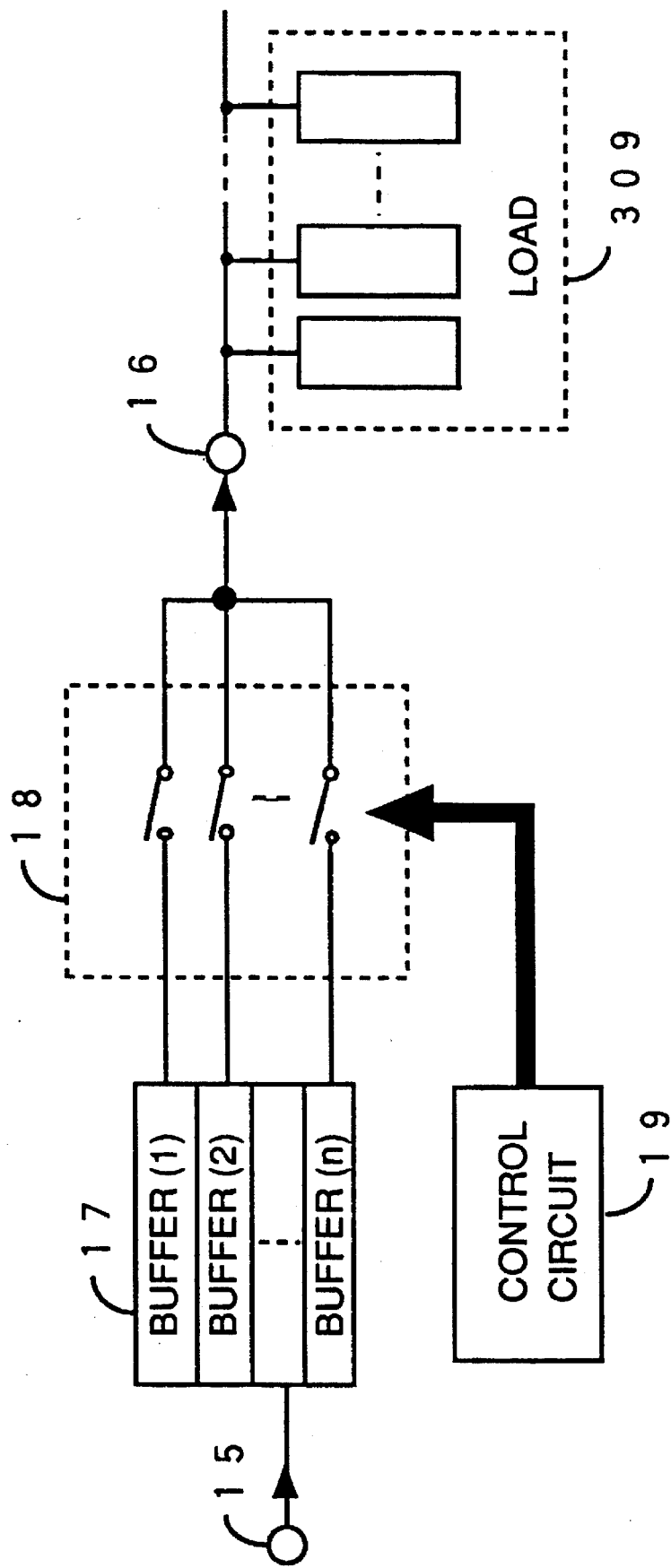
FIG. 22 shows a conventional buffer driving current switching circuit.

FIG. 20 shows a circuit diagram of a buffer circuit with driving current regulation function in the sixth embodiment of the invention. In the first~the fifth embodiments, the filter circuit and the delay element which are the reference for delay time of the output buffer circuit and the reference for rising and falling times were constituted inside IC circuit. On this account, in case that temperature of IC and power supply voltage vary, capacity value and resistance value used in the filter also vary, which causes delay time of the delay element used as reference to vary. To solve this problem, in the sixth embodiment, a filter circuit is equipped outside IC so that the filter circuit is not affected by temperature variation. Thereby, stable output buffer characteristics is thus obtained which is not affected by temperature.

Embodiments described above are only examples and the invention is not limited by them. For example, although the characteristics of output buffer is adjusted in the embodiments, the invention is also applicable to a buffer having bi-directional input/output signal.

What is claimed is:

1. A buffer circuit with driving current adjusting function comprises:

a buffer circuit which is controlled by a control signal for supplying a most appropriate driving current to a load;

a load detecting circuit for detecting a phase difference between an input signal and an output signal of said buffer circuit and for outputting voltage corresponding to said phase difference, a control signal generating circuit for generating a signal which controls the driving current of said buffer circuit in response to an output signal of said load detecting circuit, said control signal generating circuit controls said buffer circuit so that driving current may increase when delay time between input and output of said buffer circuit becomes long, and also controls said buffer circuit so that driving current may decrease when delay time between input and output of said buffer circuit becomes short.

2. A buffer circuit with driving current adjusting function of claim 1, wherein a delay element, and a filter circuit comprised of capacity and resistor in said load detecting circuit are equipped at outside of the semiconductor IC.

3. A buffer circuit with driving current adjusting function comprises:

a buffer circuit which is controlled by a control signal for supplying a most appropriate driving current to a load;

a load detecting circuit for outputting logical signal having a plurality of bits obtained from rising edge waveform or falling edge waveform of output signal of said buffer circuit;

a control signal generating circuit for generating a signal which controls the driving current of said buffer circuit in response to said plurality of bit, said control signal generating circuit generates more logical bits and then controls said buffer circuit so that driving current may increase when delay time between input and output of said buffer circuit becomes long, and also generates less logical bits and then controls said buffer circuit so that driving current may decrease when delay time between input and output of said buffer circuit becomes short.

4. A buffer circuit with driving current adjusting function of claim 3, wherein;

said load detecting circuit comprises a phase difference detector and a counter circuit;

said load detecting circuit comprises two sets of inverters having different operating points (threshold) and an XOR logical gate to which an output of each inverter is supplied and generates a pulse corresponding to a phase difference between two points of rising edge pulse wave or failing edge pulse wave of output signal of buffer circuit;

said counter circuit counts pulse number detected in said phase difference detector and applies the most significant bit (MSB) of the counter to input terminals of respective flip- flops, and then the counter circuit outputs logical value "1" to any n-parallel output terminals of respective flip flop every time when MSB changes from "0" to "1".

5. A buffer circuit with driving current adjusting function of claims 3, wherein a delay element, and a filter circuit comprised of capacity and resistor in said load detecting circuit are equipped at outside of the semiconductor IC.

6. A buffer circuit with driving current adjusting function comprising;

a buffer circuit which is controlled by a control signal for supplying a most appropriate driving current to a load;

a load detecting circuit for generating a pulse signal according to phase difference between a signal which the input of the buffer circuit being delayed for a predetermined time and an output signal of said buffer circuit; and a control circuit which for outputting logical signal having a plurality of bits in response to said output pulse of said load detecting circuit, wherein when a phase difference becomes large between the signal which the input of the buffer circuit being delayed for a predetermined time and the output signal of said buffer circuit, said control circuit generates many logical bits and controls to cause the driving current of said buffer circuit to increase, and when the phase difference becomes small, said control circuit generates less logical bits and controls to cause the driving current of said buffer circuit to decrease.

7. A buffer circuit with driving current adjusting function of claim 6 comprises:

an enable circuit which is controlled by an enable signal between an input-output signal and a load detecting circuit;

said enable circuit controls said input and output signals to be applied to said load detecting circuit when said enable signal is either one of the logical signal (for example, logical value "1"), said enable circuit further controls to prevents said input and output signals to be applied to said load detecting circuit when said enable signal is the other logical signal (for example, logical value "0"), thereby a signal is not outputted from said load detecting circuit and driving current of the buffer circuit is fixed since logical signal value of a plurality of bits is fixed.

8. A buffer circuit with driving current adjusting function of claims 6, wherein a delay element, and a filter circuit comprised of capacity and resistor in said load detecting circuit are equipped at outside of the semiconductor IC.

9. A buffer circuit with driving current adjusting function comprises:

a buffer circuit which is controlled by a control signal for supplying a most appropriate driving current to a load;

a load detecting circuit for generating a pulse signal according to phase difference between a signal which the input of the buffer circuit being delayed for a predetermined time and an output signal of said buffer circuit;

a counter circuit for counting pulse signal of said load detecting circuit and for outputting logical signal having a plurally of bits; and a driving current control signal generating circuit for generating a control signal which controls driving current of said buffer circuit in response to said logical signal having a plurally of bits, wherein when a phase difference becomes large between the signal which the input of the buffer circuit being delayed for a predetermined time and the output signal of said buffer circuit, said control circuit generates many logical bits and controls to cause the driving current of said buffer circuit to increase, and when the phase difference becomes small, said control circuit generates less logical bits and controls to cause the driving current of said buffer circuit to decrease.

10. A buffer circuit with driving current adjusting function of claim 9, wherein said counter circuit comprises a counter and a plurality of flip flops, said counter digitally counts a phase difference between the input and output signal, the most significant bit (MSB) of the counter is inputted into input terminal of respective flip-flops and then logical value "1" is outputted to a parallel output terminals of one of n flip- flops every time when a counted value of said counter exceeds a predetermined threshold value assigned to each flip flop.

11. A buffer circuit with driving current adjusting function of claim 9, wherein a delay element, and a filter circuit comprised of capacity and resistor in said load detecting circuit are equipped at outside of the semiconductor IC.

* * * * *